United States Patent [19]

Vieweg-Gutberlet et al.

[11] 4,021,735

[45] May 3, 1977

[54] METHOD AND APPARATUS FOR MAKING A METAL TO SEMICONDUCTOR CONTACT

[75] Inventors: Fritz Vieweg-Gutberlet, Burghausen, Germany; Peter Siegesleitner, Braunau, Austria

[73] Assignee: Wacker-Chemitronic Gesellschaft fur Elektronik Grundstoffe mbH, Burghausen, Germany

[22] Filed: Oct. 22, 1975

[21] Appl. No.: 624,797

[30] Foreign Application Priority Data

Nov. 20, 1974 Germany .......................... 2455040

[52] U.S. Cl. .......................... 324/158 P; 324/60 C
[51] Int. Cl.² .................. G01R 1/06; G01R 31/26; G01R 27/26
[58] Field of Search ........... 324/158 P, 158 F, 72.5, 324/158 D, 60 C, 158 R

[56] References Cited

UNITED STATES PATENTS 3,794,912  2/1974  Severin et al. ................. 324/158 D Primary Examiner—Rudolph V. Rolinec
Assistant Examiner—Ernest F. Karlsen
Attorney, Agent, or Firm—Allison C. Collard

[57] ABSTRACT

A method and apparatus for making a reproducible, pressure and surface constant metal to semiconductor contact for voltage capacitance measurements on semiconductor samples with mercury as the metal component, wherein the mercury is pressed through a contact tubule having a constant diameter against a semiconductor surface by means of a movable pressure piston under a reproducible constant pressure from a supply vessel.

4 Claims, 1 Drawing Figure

U.S. Patent
May 3, 1977
4,021,735
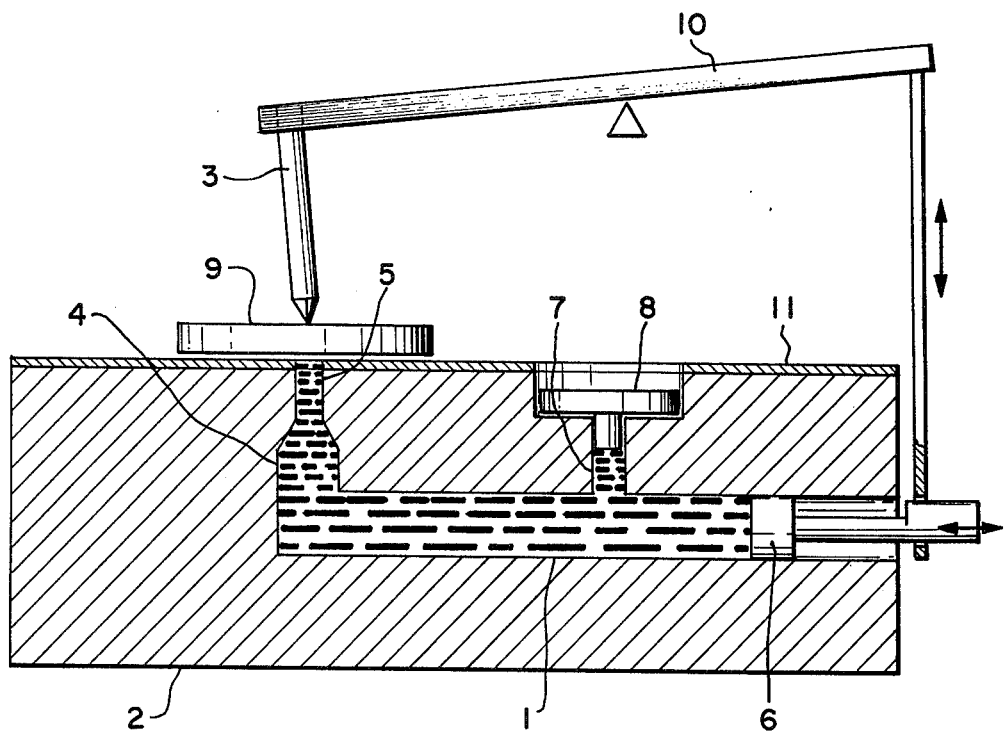

METHOD AND APPARATUS FOR MAKING A METAL TO SEMICONDUCTOR CONTACT

The invention relates to a method for making a reproducible, pressure and surface constant metal semiconductor contact for voltage-capacitance measurements on semiconductor samples with mercury as the metal component, and a device for carrying out the method.

It is know to use a drop of mercury as a contact with respect to a semiconductor surface. For this purpose, a mercury column is constructed in a tight contact tubule which is closed at one side by the semiconductor surface. The structure of this mercury column is in accordance with a system of communicating pipes by R. Hammer, "Review of Scientific Instruments" 40 (1970). In this structure, the tubule is disposed on a U-shaped hose which is filled with mercury, the tubule being mounted thereto on one end. The semiconductor sample is pressed against the outlet end of the tubule, and at the other end, there is provided an expansion tank. By lifting the expansion tank, the mercury flows into the tubule and is in contact with the semiconductor surface. The constancy of the contact pressure is assured by lifting the expansion tank to a constant height.

In accordance with the method of P.J. Severin, Paper No. 75, Spring Meeting of the Electrochemical Society in Chicago, May 1973 the construction of the mercury column is in the contact tubule and thereby the associated contact pressure is accomplished by means of pneumatic pressure. From a pneumatic pressure line, a defined air pressure is applied to one side of a supply vessel filled with mercury through a reduction valve and to the associated contact tubule, so that the mercury rises in the contact tubule and engages the semiconductor surface.

Aside from the fact that the above-mentioned methods are rather cumbersome, a danger also exists that the highly poisonous mercury may exit from the tubule if not closed by a semiconductor sample. On the other hand, it is a prerequisite to push the mercury under a set and reproducible constant pressure against the semiconductor surface, because otherwise due to the high surface tension of the mercury, reproducible constant contact diameter could not be obtained at the contact place at the semiconductor sample. In the absence of constant pressure, different meniscuses would form at the edges of the mercury contact. However, in order to maintain the contact surface constant from measurement to measurement, the mercury must be pressed against the semiconductor surface with reproducible constant pressure.

It is therefore an object of the present invention to provide a method for making a reproducible, pressure and surface constant metal to semiconductor contact for voltage-capacitance testing on semiconductor samples, wherein the mercury is pressed by means of a movable pressure piston under a reproducible constant pressure from a supply vessel through a contact tubule having a constant diameter, against a semiconductor surface.

Other objects and features of the present invention will become apparent from the following detailed description considered in connection with the accompanying drawing which discloses several embodiments of the invention. It is to be understood, however, that the drawing is designed for the purpose of illustration only and not as a definition of the limits of the invention.

In the drawing, wherein similar reference characters denote similar elements throughout the several views:

The only FIGURE schematically shows a device for carrying out the present invention.

Referring now to the drawing, according to the present invention, there is provided a mercury electrode 1, a housing 2 receiving the mercury electrode 1, and a rear contact 3 provided on the upper surface of the housing 2. In accordance with the invention, a pipe-like supply vessel 4 for the mercury is closed at one end by a movable pressure piston, 6, and passes at the other side into a contact tubule 5 which opens in housing 2, which contains the mercury electrode. The constant pressure is preferably obtained in that the contact tubule 5 is connected with an expansion vessel 7, which is closed off by a freely movable balancing piston 8. The mercury level in the supply vessel 4 is preferably adjusted such that when the pressure piston 6 is completely retracted, no mercury is present at all in contact tubule 5. When the pressure piston 6 is moved forwardly, the mercury rises in the contact tubule until it engages a semiconductor surface of a sample 9. During the further forward movement of pressure piston 6, the mercury slowly flows into the expansion vessel 7 and lifts the balancing piston 8 from the support surface. Therefore, the contact pressure on the surface of the semiconductor 9 is primarily defined by the weight of the balancing piston 8. Thereby, constant pressure is obtained in the completely closed system without requiring an outside air pressure source.

Due to rear contact 3 which suppresses the semiconductor sample 9, the sample cannot be lifted by the mercury pressure. The rear contact is preferably, for example, a 4 point probe head with square arrangement of the probes. The advantage is that the tungsten carbide probe tips penetrate an eventually present boundary layer better than would be possible with a surface contact. It is also advantageous to couple a movement mechanism 10 of rear contact 3 with the movement of pressure piston 6, so that the pressure piston 6 can only be moved forwardly when semiconductor sample 9 is firmly pressed onto the outlet of contact tubule 5 by rear contact 3, whereby the system is safe against an unintentional exiting of highly poisonous mercury.

In particular, the danger always exists when using an air pressure system, that if there is a break during the measuring or testing, mercury would be blown out by the air pressure. In the present invention, if lever 10 which moves pressure piston 6 in the direction of the mercury column is actuated until it engages a limit stop, so that only enough mercury is pressed by the pressure piston 6 from supply vessel 4 in balancing vessel 7, then balancing piston 8 is merely lifted. Should the semiconductor sample break, only a minute drop of mercury may escape from the outlet portion of contact tubule 5. However, this minute drop of mercury can be easily sucked back into the contact tubule 5 by retracting the piston 6. The diameter of the contact tubule 5 is about 0.3 to 1 mm, and preferably between 0.4 to 0.6 mm. Balancing piston 8 which, for example, consists of lead is so dimensioned that a pressure of $10^4$ to $6 \times 10^4$ Pa preferably $2.5 \times 10^4$ to $3.5 \times 10^4$ Pa is exerted onto semiconductor sample 9 by the mercury. A pressure of at least $10^4$ Pa is required in order to prevent undefined meniscuses at the edges of the mercury contact, while at a pressure of more than 6 ×10⁴ Pa, the danger exists that mercury is pressed between the semiconductor sample and the support surface. However, both phenomena would result in non-reproducible contact surfaces and the result of the tests would be misleading.

The definition of the carrier concentration in a semiconductor sample is commonly carried out in accordance with the voltage-capacitance method by means of a high frequency capacity measuring bridge. Thus, any stray capacity plays an essential role for the reproducibility of the results. These stray capacities are composed of the stray capacity between the semiconductor sample and the mercury column and, of the stray capacity between the mercury electrode and of the environment (the so-called "hand capacity"). To avoid possible "hand capacities", a mercury electrode is mounted in a screened box. This, however, does not eliminate the different stray capacities due to different sizes of the semiconductor samples, so that the stray capacity must be tested again from measurement to measurement and must be compensated.

In a preferred embodiment of the invention, as shown in the drawing, this problem is solved by providing a large surface electrical screen 11 between semiconductor sample 9 and mercury supply vessel 4. The electrical screen consists, for example, of a metal foil which may be aluminum or any other suitable material which does not form any amalgam. The screen covers the portion of housing 2 which is directed towards semiconductor sample 9 and encompasses the free end of contact tubule 5. Thereby, the capacitive characteristics around the contact tubule 5 remain stable and are defined exclusively by the screen surface 11. In order to calibrate the stray capacity between the mercury column in the contact tubule 5 and the electrical screen 11, the screen is coupled to the ground electrod of the measuring system. The stray capacity between the mercury column in the contact tubule 5 and the electrical screen 11 is uniform, and independent of the shape of the semiconductor sample, or from the so-called hand capacities, so that the measurements are accomplished in a substantially simplified manner.

In view of the method of the present invention and the device used for carrying out the method, precise voltage capacitance measurements on semiconductor samples, for example, the determination of the electrical resistivity, or the determination of the carrier concentration in a semiconductor, are substantially simplified.

EXAMPLE

With the device of the invention, reproducibility tests for the contact surface diameter in silicon slices or waters were carried out.

The result after 500 successive measurements at a mercury pressure on the semiconductor surface of 3 ×10⁴ Pa for a contact surface diameter of 0.5 mm, showed a maximum deviation of ±0.3% and a standard deviation of ±0.12%. These tolerances are completely sufficient for the use of voltage capacitance measurements. Futhermore, the error distribution was statistical which shows that no mercury remained at the semiconductor sample, nor was there any loss of mercury anywhere else in the system.

While only a few embodiments of the present invention have been shown and described, it will be obvious to those skilled in the art that many changes and modifications may be made thereunto without departing from the spirit and scope of the invention.

What is claimed is:

1. A method for producing a reproducible, pressure constant and surface constant metal to semiconductor contact for voltage capacitance measurements on semiconductor samples with mercury as the metal component, comprising the step of pressing mercury under reproducible constant pressure from a supply vessel against the semiconductor surface through a contact tubule having a constant diameter; and applying the mercury which is pressed under the constant pressure to an expansion vessel to exert uniform contact reproducible pressure onto the surface of the semiconductor.

2. A device for producing a reproducible, pressure and surface constant metal to semiconductor contact for voltage capacitance measurements on semiconductor samples with mercury as the metal component comprising a housing containing a mercury electrode, a rear contact mounted above the surface of said housing, a pipe-shaped supply vessel for the mercury disposed in said housing and forming at one end thereof a contact tubule having /an outlet opening which discharges from said housing, an expansion vessel connected to said supply vessel, and thereby to said contact tubule, a balancing pistion movably disposed in said expansion vessel and closing said expansion vessel and-- has been added.

a movable pressure piston disposed in the other end of said supply vessel and closing said other end of said supply vessel in pressure communication with said contact tubule, thereby maintaining constant reproducible pressure.

3. The device according to claim 2 further comprising means for coupling said movable pressure piston to said rear contact for moving said pressure piston only when said outlet opening of said contact tubule is closed by the semiconductor sample with said rear contact holding down the semiconductor sample.

4. The device according to claim 2 further comprising an electrical screen surrounding said contact tubule and disposed on an upper portion of said housing between said housing and the semiconductor sample.

* * * * *